United States Patent [19]
Alphonse

[11] Patent Number: 6,018,536
[45] Date of Patent: Jan. 25, 2000

[54] MULTIPLE-WAVELENGTH MODE-LOCKED LASER

[75] Inventor: Gerard Argant Alphonse, Princeton, N.J.

[73] Assignee: Sarnoff Corporation, Princeton, N.J.

[21] Appl. No.: 09/246,982

[22] Filed: Feb. 9, 1999

Related U.S. Application Data

[60] Provisional application No. 60/109,349, Nov. 20, 1998.

[51] Int. Cl.[7] ........................................................ H01S 3/10
[52] U.S. Cl. .................... 372/23; 372/18; 372/6; 372/29; 372/32; 372/38
[58] Field of Search .................... 372/23, 18, 6, 372/29, 38, 32

[56] References Cited

U.S. PATENT DOCUMENTS

| | | | |
|---|---|---|---|
| 5,210,764 | 5/1993 | Bücher et al. | 372/23 |
| 5,276,694 | 1/1994 | Wolf et al. | 372/20 |
| 5,276,695 | 1/1994 | Scheps | 372/20 |
| 5,479,422 | 12/1995 | Fermann et al. | 372/18 |
| 5,526,155 | 6/1996 | Knox et al. | 359/130 |
| 5,708,672 | 1/1998 | Pessot et al. | 372/23 |
| 5,802,086 | 9/1998 | Hargis et al. | 372/22 |
| 5,805,623 | 9/1998 | Utano et al. | 372/23 |
| 5,835,512 | 11/1998 | Wada et al. | 372/23 |

OTHER PUBLICATIONS

4x2.5–Gbit/s WDM–TDM Laser Source Based on Mode–Locked Semiconductor lasers, Hong Shi, Peter J. Delfyett, SPIE vol. 3075, pp. 60–64.

Four–wavelength, 10–GHz Picosecond Pulse Generation from an Active Mode–Locked Single–Strip Diode Laser, H. Shi, G.A. Alphonse, J.C. Connolly, P.J. Delfyett, Cleo '97, p. 86, May 20, 1997.

*Primary Examiner*—Leon Scott, Jr.
*Attorney, Agent, or Firm*—William J. Burke

[57] ABSTRACT

A laser produces light having multiple wavelengths. The laser comprises a gain medium disposed within the laser resonance cavity, a dispersion element coupled to the gain medium and within the laser resonance cavity, and a wavelengths-elective element coupled to the dispersion element and defining an end of the resonance cavity. The wavelength-selective element has non-abutting reflective segments. At least one of the multiple wavelengths corresponds to a position of at least one segment from the non-abutting reflective segments.

21 Claims, 5 Drawing Sheets

MULTIPLE-WAVELENGTH MODE-LOCKED LASER

CROSS-REFERENCE TO RELATED PATENT APPLICATION

This patent application claims the benefit of U.S. Provisional application Ser. No. 60/109,349 entitled Multiple Wavelength Mode-Locked Laser and filed on Nov. 20, 1998, the entire contents of which are incorporated herein by reference.

BACKGROUND OF THE INVENTION

The present invention relates generally to a multiple-wavelength laser. More specifically, the present invention relates to a multiple-wavelength mode-locked laser that can be used in wavelength-division multiplexing (WDM) communications.

A known multiple-wavelength laser has a gain medium that produces multiple wavelengths corresponding to multiple longitudinal modes of the laser's resonance cavity. See Four-wavelength, 10-GHZ picosecond pulse generation from an active mode-locked single-stripe diode laser, H. Shi, G. A. Alphonse, J. C. Connolly, P. J. Delfyett, Cleo '97, p. 86, May 20, 1997. This multiple-wavelength laser includes a grating and spatial filter arrangement within the resonance cavity. The grating and spatial filter arrangement angularly separates the wavelength components produced by the gain medium and eliminates some of these wavelength components by absorption of the spatial filter. This laser also diverts a portion of the light from the grating to perform diagnostics on the laser light.

This multiple-wavelength laser, however, requires a large number of components that affect the compactness and durability of the laser. In addition, wavelength stabilization is not easily performed by the above-described laser and single-transverse-mode operation can result in some loss of output power.

SUMMARY OF THE INVENTION

Disadvantages of the known multiple-wavelength laser can be alleviated by the present invention. In one embodiment of the present invention, a multiple-wavelength laser comprises a gain medium disposed within the laser resonance cavity, a dispersion element coupled to the gain medium and within the laser resonance cavity, and a wavelength-selective element coupled to the dispersion element and defining an end of the resonance cavity. The wavelength-selective element has non-abutting reflective segments. At least one of the multiple wavelengths corresponds to a position of at least one segment from the non-abutting reflective segments.

In another embodiment of the present invention, a wavelength-stabilization circuit for use with the laser includes a comparator and a controller. The comparator produces a difference signal based on a first detected signal and a second detected signal. The first detected signal is based on a first set of wavelength components and a second set of wavelength components different from the first set of wavelength components. The controller varies the bias current and/or the temperature of the laser based on the difference signal.

DETAILED DESCRIPTION

A multiple-wavelength laser comprises a gain medium disposed within the laser-resonance cavity, a dispersion element coupled to the gain medium and disposed within the laser resonance cavity, and a wavelength-selective element coupled to the dispersion element and defining an end of the laser resonance cavity. The wavelength-selective element has non-abutting reflective segments. At least one of the multiple wavelengths corresponds to a position of at least one segment from the non-abutting reflective segments.

The term "coupled" is used herein to include, but is not limited to, two components being associated such that energy sent by one component is received by the other component. Where the components are optical components sending and receiving light, the optical components can be connected, for example, by an optical fiber(s), fiber-coupling device(s), and/or collimator(s) as appropriate to maximize the light sent and received. Alternatively, optical components can be coupled by their physical arrangement so that one component sends light along an optical path and the other component receives the light along that path. Where the components are electronic components, they can be coupled by, for example, conventional wiring.

Figure 1:
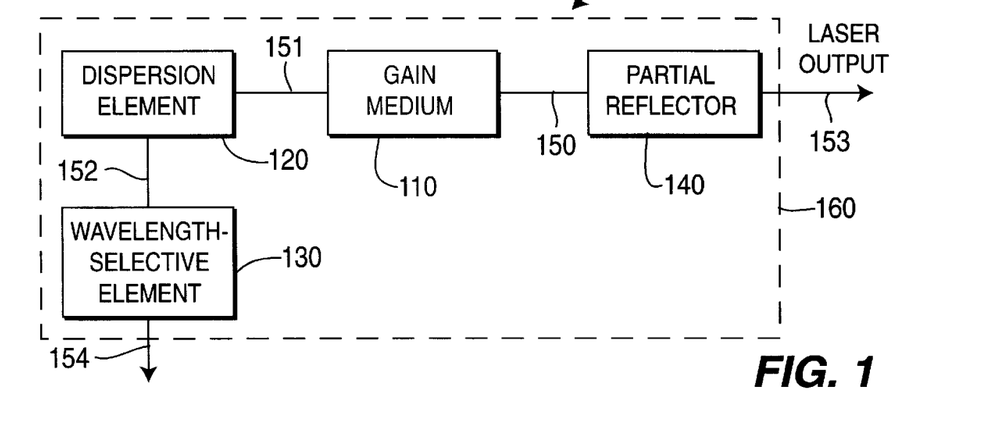
FIG. 1 illustrates a multiple-wavelength laser according to an embodiment of the present invention.

FIG. 1 illustrates a multiple-wavelength laser according to an embodiment of the present invention. The laser 100 includes a gain medium 110 coupled to a dispersion element 120 and to a partial reflector 140. Dispersion element 120 is coupled to a wavelength-selective element 130. The partial reflector 140 and the wavelength-selective element 130 form the boundaries of the resonance cavity 160 of laser 100.

Gain medium 110 produces light along optical path 150 towards partial reflector 140 and along optical path 151 towards dispersion element 120. Dispersion element 120 disperses the light along optical path 152 to wavelength-selective element 130 which reflects a portion of the light back along the optical path 152 to dispersion element 120. Partial reflector 140 reflects at least a portion of the light back along optical path 150 to gain medium 110 and allows at least a portion of the light to be emitted from laser 100 along optical path 153. The light emitted along optical path 153 is the output of laser 100.

Gain medium 110 can be any type of medium that produces optical gain in such a manner that multiple longitudinal modes are produced. For example, gain medium 110 can comprise a superluminescent diode (SLD) as described in U.S. Pat. Nos. 4,958,335; 4,821,277; 4,821,276; and 4,789,881 all of which are incorporated herein by reference. Alternatively, gain medium 110 can comprise a high power double tapered SLD in the shape of a diamond-like structure as described in pending U.S. patent application Ser. No. 08/857,920, entitled Light Emitting Semiconductor Device and filed on May 16, 1997, which is incorporated herein by reference. Alternatively, gain medium 110 can comprise a high power semiconductor light source having multiple SLDs as described in pending U.S. patent application Ser. No. 09/158,847, entitled High Power Semiconductor Light Source and filed on Sep. 23, 1998, the entire contents of which are incorporated herein by reference. The SLD is a broad spectral-width optical light source that can function as a broad band optical amplifier at any of the wavelengths for which semiconductor lasers can be made, for example at 1550 nm for optical communications. At this wavelength region, its full-width half-maximum (FWHM) spectral width is 30 to 40 nm, which is equivalent to 4000 GHZ.

Note that the light generated by gain medium 110 has multiple wavelength components that correspond to multiple longitudinal modes of laser 100. More specifically, each longitudinal mode of the resonance cavity of laser 100 corresponds to a wavelength component of light generated by gain medium 110 having its own corresponding center wavelength. The particular center wavelength corresponding to each longitudinal mode is based at least in part on the length of the resonance cavity of the laser. These wavelength components of the light are aligned temporally and spatially when emitted from gain medium 110.

Dispersion element 120 can be any known device that spatially separates the wavelength components of the light received from gain medium 110 along optical path 151. Dispersion element 120 spatially separates the light received from gain medium 110 into a fan-like arrangement spreading the different wavelengths of the light. Dispersion element 120 also receives light reflected from wavelength-selective element 130 along optical path 152, angularly reassembles the light and sends it towards gain 110 medium along optical path 151. Dispersion element 120 can be, for example, a grating or a prism. In embodiments where dispersion element 120 is a grating, the grating blazing can be controlled to maximize the throughput of dispersion element 120.

Figure 2:
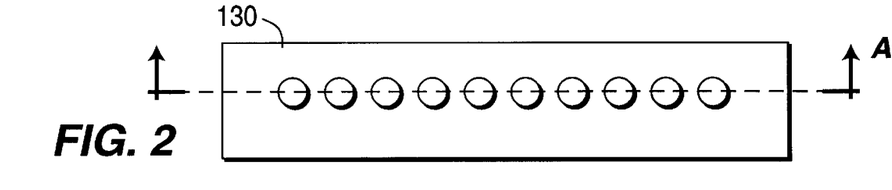
FIG. 2 shows a top view of the wavelength-selective element of the multiple-wavelength laser shown in FIG. 1.
Figure 3:
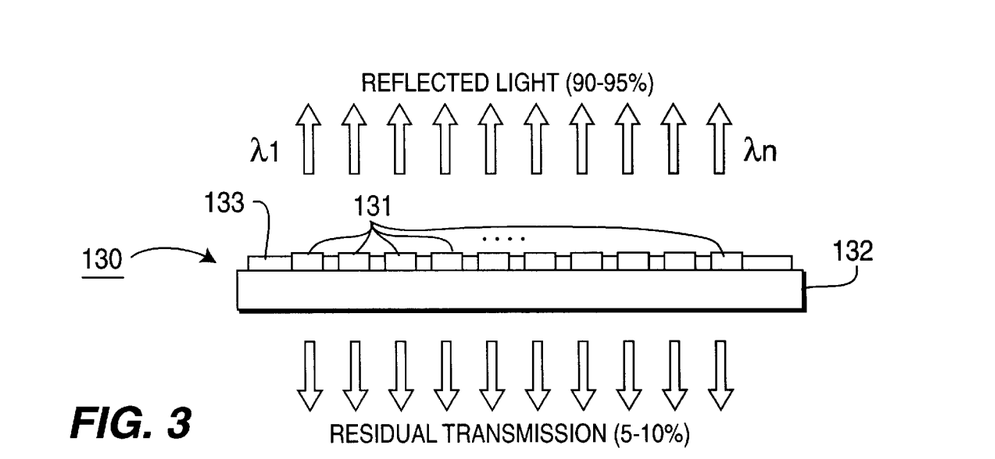
FIG. 3 shows a cross-sectional view of the wavelength-selective element shown in FIG. 2.

FIG. 2 shows a top view of the wavelength-selective element of the multiple-wavelength laser shown in FIG. 1. FIG. 3 shows a cross-sectional view of the wavelength-selective element shown in FIG. 2. Wavelength-selective element 130 reflects a portion of the light received from dispersion element 120 back towards dispersion element 120 along optical path 152. Wavelength-selective element 130 also transmits a remaining portion of light along optical path 154 and/or absorbs a remaining portion of the light received from dispersion element 120.

The wavelength-selective element 130 has a set of non-abutting reflecting segments 131 where the position of at least one segment of the non-abutting reflecting segments 131 corresponds to at least one wavelength component of light received along optical path 152. The non-abutting reflective segments 131 can be, for example, an array of reflectors or mirror dots disposed on a substrate 132. In one embodiment, for example, the reflectors of the non-abutting reflective segments 131 can have a 90 to 98 percent reflectance. In other embodiments, the reflectors of the non-abutting reflective segments 131 can have another reflectance that allows a sufficient amount of light to be reflected so that resonance can be achieved. The substrate 132 can be made of, for example, glass or mirror. The non-abutting reflective segments 131 can be surrounded by an absorber 133 which absorbs the light incident on it.

One possible approach for fabricating the wavelength-selective element 130 is to deposit or etch a thin layer of metal (e.g., gold or aluminum) on a transparent substrate such as glass. The metal thickness can be chosen so that a residual amount of transmitted light is available for wavelength stabilization described below. In one embodiment, for example, the metal thickness is such that the transmission of the metal is 5 to 10%. Alternatively, the reflective layer can be constructed from an interference filter comprising alternate quarter-wavelength layers of high and low refractive index material (such as silicon and aluminum oxide); the number of layer airs (e.g., six layers) can be chosen to obtain the desired reflectance and spectral response.

Once the material is deposited, the individual non-abutting reflective elements 131 can be defined by photolithography and/or etching using a mask to remove the material from the space surround the desired location of the non-abutting reflective elements 131 (see, e.g., FIG. 2). Although the non-abutting reflective elements are shown in FIG. 2 as circular, these elements can be other shapes such as rectangular, triangular, octangular, etc.

In embodiments where the substrate 132 is glass, the clear space surrounding the non-abutting reflective elements will likely have a low reflectance to produce stray components of reflected light. The low reflectance is insignificant compared to the higher reflectance of the non-abutting reflective elements. In one embodiment, for example, the clear space surrounding the non-abutting reflective elements has a reflectance of 4% and the non-abutting reflective elements have a reflectance over 90%.

These stray components of reflected light, however, can be eliminated by the deposition of a black absorber 133 through a protective mask covering the non-abutting reflective elements. Absorber 133 can be made, for example, by depositing a black absorber through a protective mask that covers the non-abutting reflecting segments 131. Alternatively, where substrate 132 is a reflective material such as aluminum, the stray components of reflected light can be eliminated by anodizing the substrate 132 while a mask covers the non-abutting reflective elements. Finally, an optional anti-reflection (AR) coating can be added to the transmission side of the substrate to prevent any resonance effect in the substrate itself that could change the characteristics of the residual light transmitted from the wavelength-selective element.

Returning to FIG. 1, as light is generated from gain medium 110 and dispersed by dispersion element 120, the light has multiple wavelength components each having a center wavelength. Because the non-abutting reflective segments 131 of wavelength-selective element 130 are positioned to correspond to the various wavelength components of the light, only certain wavelengths are reflected back towards dispersion element 120 along path 152 while the remaining wavelength components are either absorbed by wavelength-selective element 130 and/or transmitted through wavelength-selective element 130 along path 154. Consequently, resonance is achieved only for the wavelength components of light that are reflected by wavelength-selective element 130 and allowed to travel within the resonance cavity defined by partial reflector 140 and wavelength-selective element 130.

Laser 100 can be operated as a mode-locked laser system, which can be particularly useful for optical communications.

Laser 100 can be mode locked by applying a direct-current (DC) bias current together with a current from a high-frequency radio-frequency (RF) source. In other words, a frequency generator (not shown in FIG. 1) can provide a RF signal that can be combined with a DC-bias current to drive gain medium 10. The RF signal modulates the gain of the gain medium 110 by increasing the gain during the positive swing of the RF signal and shutting off the gain during the negative swing of the RF signal. The frequency generator can produce a repetitive RF signal with various types of waveforms such as sinusoidal, rectangular, saw-tooth and others.

The length of the resonance cavity 160 of laser 100 is adjusted so that the optical round-trip time is equal to the period (or harmonics) of the RF signal. Consequently, a series of picosecond (or even femtosecond) pulses is generated at a repetition rate related to the frequency of the RF signal. The repetition rate can be changed by changing the frequency of the RF signal and the optical path length of the laser resonance cavity 160.

Figure 4:
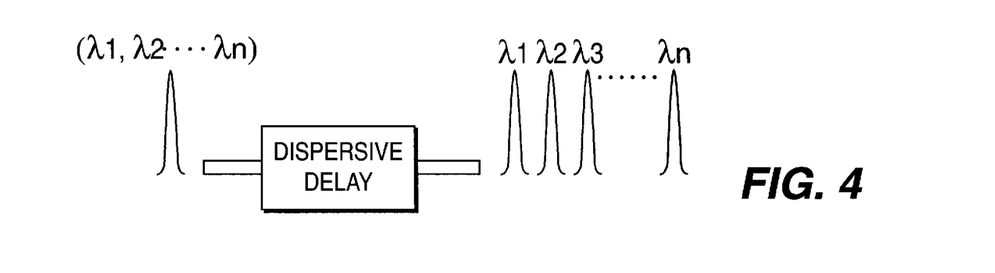
FIG. 4 shows a temporal relationship of pulses produced by the multiple-wavelength laser show FIG. 1.

The output of laser 100 transmitted along path 153 is a repetitive sequence of light pulses each of which contains all the individual wavelength components of the light simultaneously. These individual wavelength components can then be resolved or separated temporally by passing the light output from laser 100 through a dispersive delay medium or fiber that exhibits a different refractive index for each of the wavelengths. This delay imparts a different delay for each wavelength component resulting in a repetitive sequence of laser pulses at different wavelengths shifted in time so that they no longer overlap temporally. FIG. 4 illustrates such an example. As shown in FIG. 4, for each pulse output from laser system 100 (which, of course, is repeated relating to the repetition rate of the mode locking), multiple wavelength components of the light exists. As this light passes through a dispersive delay, the wavelength components of the light are separated in time to produce an output that replicates the type of output desirable for a WDM communications system.

The number of wavelengths produced by laser 100 will depend on its particular design. For example, consider where gain medium 110 is an SLD with a center wavelength of 1550 nm and a FWHM of 30 nm, and dispersion element 120 is a grating with a period of 0.75 of the wavelength. By placing a collimator (not shown in FIG. 1) 10 cm from the dispersion element 120, the non-abutting reflective elements 132 can be 4 μm wide with 1 μm spacing. The light output by this particular design has 52 wavelength components with a center-to-center separation of about 0.58 nm. The output power is substantially divided equally among the various wavelength components. Generally speaking, the greater the spectral width of the light generated by the gain medium and smaller the spacing between the non-abutting reflective elements, the greater the number of wavelength components output by the laser.

To obtain a high output power of laser 100 while providing a high number of wavelength components in the output light, gain medium 110 should have a relatively high power capability because the total output power of the laser 100 is divided among all of the wavelength components of the output light. For example, by using a diamond-like SLD described in pending U.S. patent application Ser. No. 08/857,920 and incorporated herein by reference, the total output power of laser 100 can vary from several hundred milliwatts to several watts. Similarly, more wavelength components of the output light can be obtained by cascading in the semiconductor structure segments active layers having different emission wavelengths as described in pending U.S. patent application Ser. No. 09/159,148, entitled Superluminescent Diode and Optical Amplifier With Extended Bandwidth and filed on Sep. 23, 1998, which is incorporated herein by reference.

Figure 5:
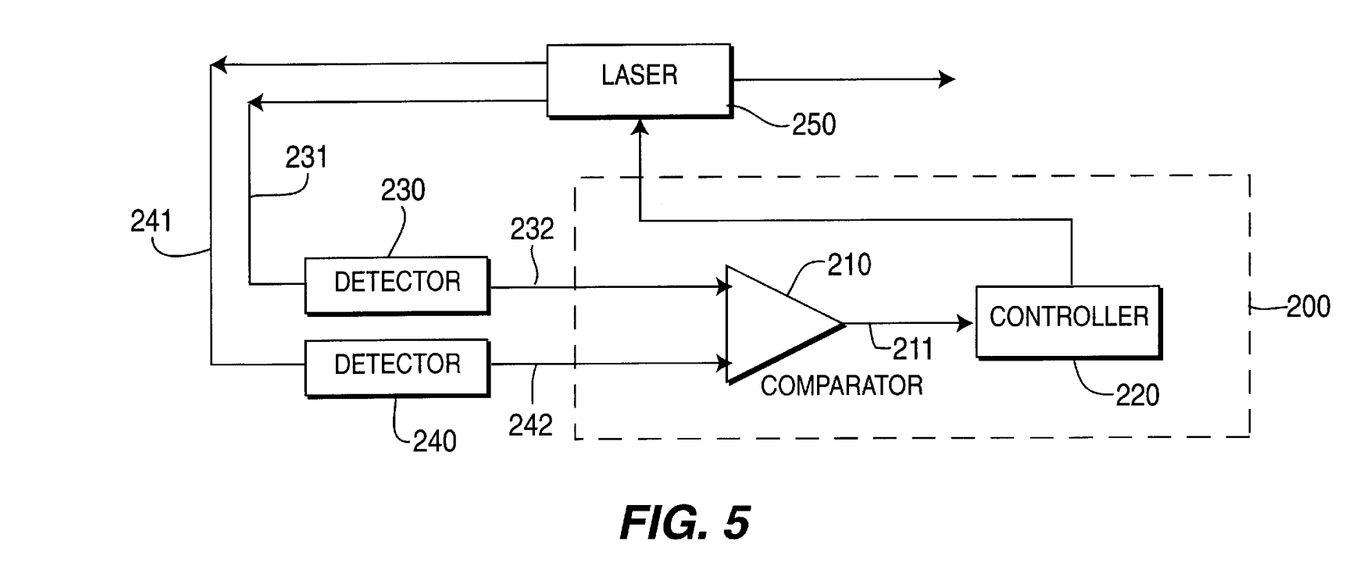
FIG. 5 illustrates a wavelength stabilization system according to another embodiment of the pre invention.

FIG. 5 illustrates a wavelength-stabilization system according to another embodiment of the present invention. Wavelength-stabilization circuit 200 can be used to stabilize a laser that produces light having multiple wavelength components that are or can be angularly (i.e., spatially) separated. For example, wavelength-stabilization circuit 200 can be used to stabilize laser 100 described above in reference to FIGS. 1–4.

Following the contextual example of laser 100, wavelength-selective element 130 of laser 100 reflects particular wavelength components of the light along path 152. Wavelength-selective element 130 also transmits a portion of those selected wavelength components of light through non-abutting reflective segments 131 along path 154, as well as absorbs (or transmits) the remaining wavelength components. The wavelength components of light that are transmitted through wavelength-selective element 130 along path 154, can be used in conjunction with the wavelength-stabilization circuit 200.

Alternatively, a portion of the light output by a multiple-wavelength laser can be diverted by, for example, a coupler. The diverted light can then be dispersed by a dispersion element that spatially separates the diverted light based on the different wavelength components of the diverted light. For example, a second coupler can separate the light into at least two wavelength components. These angularly20 separated wavelength components of the light can be used in conjunction with the wavelength-stabilization circuit 200.

Wavelength-stabilization circuit 200 comprises comparator 210 and controller 220. Comparator 210 is coupled to detectors 230 and 240 via lines 232 and 242, respectively. Comparator 210 can be a differential amplifier. Detectors 230 and 240 receive light from laser 250 along optical paths 241 and 231. Comparator 210 is coupled to controller 220 along line 211. Controller 220 is coupled to the laser 250. In embodiments where laser 250 is the laser 100 described in reference to FIG. 1, the optical path 154 described in reference to FIG. 1 has at least two portions 231 and 241 each having its own set of wavelength components of light.

At least two detectors can be used to detect the light transmitted from a laser producing light with multiple wavelength components. Detector 230 can detect one set of wavelength components of light and detector 231 can detect a different set of wavelength components of light. In other words, detector 230 produces a detected signal on line 232 based on an optical signal received from path 231; this optical signal represents at least one wavelength component of light. Detector 240 produces a detected signal 242 based on an optical signal received from path 241 which has at least one wavelength component of light different from that in the optical signal received from path 231. In one embodiment of the present invention, one-half of the wavelength components of light transmitted by laser 250 falls on detector 230 and the remaining half of the wavelength components of the light transmitted by the laser falls on detector 240. In an embodiment where the laser 250 is laser 100 discussed above in reference to FIGS. 1–4, detector 230 can be arranged to receive one-half of the wavelength components of light transmitted by wavelength-selective element 130 along path 154 and detector 240 can be arranged to receive the remaining half of wavelength components of light transmitted by wavelength-selective element 130 along path 154.

In embodiments that the laser produces 1550 nm light, detectors 230 and 240 can be, for example, semiconductor InGaAs (indium gallium arsenide) detectors or any detectors suitable to detect 1550 nm light. These detectors can be made by ordinary semiconductor device processing and are generally available commercially. Detectors 230 and 240 can be, for example, large areas or stripes, or even parallel arrays with appropriate spacing.

Detected signals on lines 232 and 242 are received by comparator 210, which produces a difference signal on line 211. When detected signals on lines 232 and 242 have an equal amplitude, the difference signal on line 211 has a zero value. When detected signals on lines 232 and 242 are unequal, the difference signal on line 211 has a positive or negative voltage corresponding to which of the detected signals on lines 232 and 242, respectively, are larger. In other words, the difference signal on line 211 has a positive value, zero value or negative value corresponding to whether the optical signal on path 241 is larger than, equal to or less than optical signal on path 231, respectively.

This unbalanced situation (i.e., the situation in which the difference signal has a positive or negative value) can occur if the spectrum of the laser-generated light shifts due to such factors as, for example, stress, aging, temperature changes and/or drive-current changes. As the spectrum of the laser-generated light shifts due to these factors, the optical signals produced along paths 231 and 241 will correspondingly change. For example, in an embodiment where the laser 250 is the laser 100 discussed above in reference to FIGS. 1–4, the wavelength components of light are associated with a specific position on wavelength-selective element 130. A shift in the spectrum of the light incident wavelength-selective element 130 can cause some of the wavelength components to miss detectors 230 and/or 240 thereby resulting in an unbalanced situation in wavelength-stabilization circuit 200.

The above-described arrangement supposes that in a balanced situation, the optical signals on paths 231 and 241 are equal (within the comparator's tolerances), as would be the case if detectors 230 and 240 receive an equal amount of light corresponding to one-half of the transmitted wavelength components. Of course, where the optical signals on paths 231 and 241 are arranged so that detectors 230 and 240 do not receive an equal amount of light in an otherwise balanced situation, the comparator 210 can be adjusted to modify its zero offset. In this manner, the comparator 210 can be tuned to operate with varying types of arrangements of the wavelength-selective element 130 with the detectors 230 and 240. Alternatively, the zero offset of comparator 210 can be adjusted to tune the laser 200 to a desired output spectrum; this can be particularly useful in the multiplexing of several multiple-wavelength lasers for use in WDM communications requiring more WDM channels than can be delivered by a single multiple-wavelength laser.

Where an unbalanced condition exists, wavelength-stabilization circuit 200 compensates for the spectrum shift in the laser output and returns the spectrum to its stabilized condition. Controller 220 makes adjustments to the laser based on the received difference signal on line 211. Controller 220 can include, for example, a thermoelectric cooler (TEC) controller and/or a bias current controller coupled to the laser.

The gain medium of the laser, for example an SLD, can be bonded to one of the faces of a TEC to prevent the gain medium from overheating during operation. The TEC controller can be used to control the TEC through adjustments in an applied electric current; the TEC in turn controls the temperature of the gain medium, which in turn affects the output spectrum of the laser. The gain medium can be cooled by applying a current of one polarity to the TEC or the gain medium can be heated by applying a current of the opposite polarity. Thus, the magnitude and polarity of the current applied to the TEC controls the temperature of the gain medium which correspondingly modifies the spectrum (i.e, the particular wavelength components) of the output light.

The bias current controller can also be used for wavelength stabilization. By varying the bias current driving the gain medium, the spectrum of the laser output can be adjusted. Typically, adjusting the spectrum of the laser output by varying the bias current results in a finer adjustment than by varying the applied current to the TEC.

Where the gain medium is an SLD, for example, the output spectrum is shifted with respect to temperature at a rate of 300 to 400 ppm/deg C and is shifted with respect to the bias current at a rate of about 40 ppm/mA. Note that the term "ppm" (parts per million) refers to the fractional wavelength change. At 1550 nm, the TEC controller adjusts the output spectrum of an SLD about 0.5 to 0.6 nm/deg C; the bias current controller adjusts the output spectrum of an SLD about 0.06 nm/mA. Because the TEC can control the temperature of an SLD to within about 0.2 deg C, the TEC controller can control the output spectrum to within about 0.01 nm. Because the bias current controller can control the bias current to within about 0.02 deg C, the bias current controller can control the output spectrum to within about 0.001 nm. Consequently, the TEC controller and bias current controller can be used together to provide course stabilization and fine stabilization, respectively. Generally speaking, the wavelength-stabilization circuit 200 can control the accuracy of individual wavelengths of the laser output spectrum to about 1 ppm.

Wavelength stabilization circuit 200 shown in FIG. 5 can also be modified to monitor the output power of laser 250. A summer (not shown in FIG. 5) can be added to wavelength-stabilization circuit 200 so that the summer receives the detected signals on lines 232 and 242 and produces a sum signal that is related to the output power of laser 250. In other words, the output power of laser 250 can be monitored based on the sum signal produced by summing detected signals on lines 232 and 242.

Figure 6:
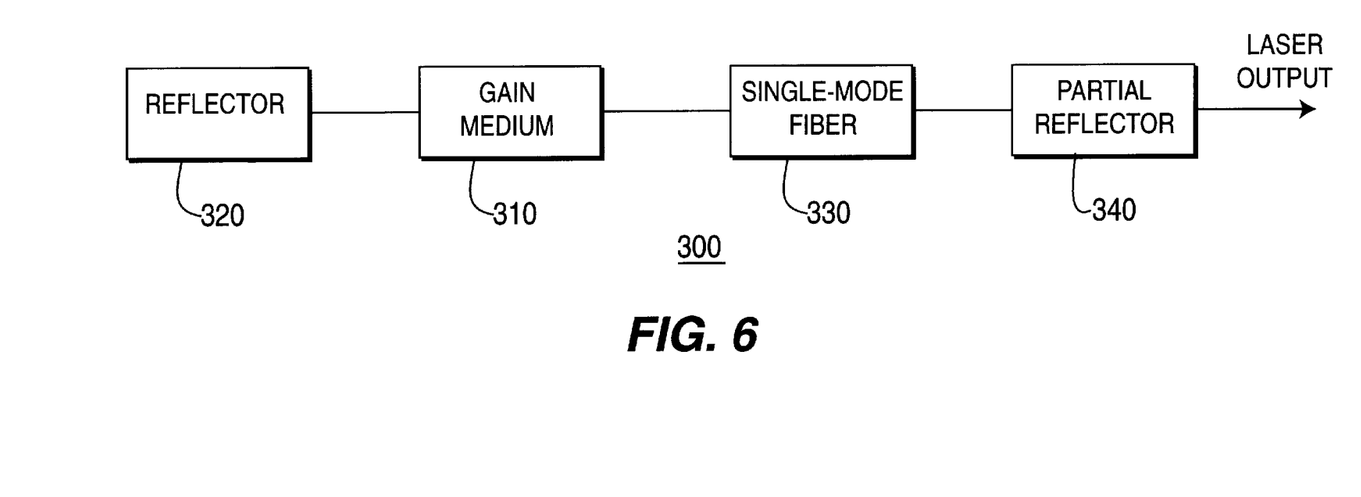
FIG. 6 illustrates a laser according to another embodiment of the present invention.

FIG. 6 illustrates a laser according to another embodiment of the present invention. Laser 300 comprises gain medium 310, reflector 320, single-mode fiber 330 and partial reflector 340. Gain medium 310 produces light along an optical path to reflector 320 and to partial reflector 340 through single mode fiber 330. The resonance cavity of laser 300 is formed by reflector 320 and partial reflector 340.

Similar to the gain medium discussed above, gain medium 310 is any type of appropriate medium that can produce high output power. High output power can be obtained, for example, by increasing the cross-section of the emitted beam greater than the typical cross-section of the emitted beam for single-mode semiconductor laser structures. Such a gain medium having a larger emitted beam cross-section can produce energy with multiple transverse modes (and possibly multiple longitudinal modes) during lasing action. The partial reflector 340 can be located within the single-mode fiber as long as at least a portion of the single-mode fiber is disposed within the resonance cavity of laser 300. The remaining portion of single-mode fiber 330 can be directly coupled to, for example, the transmission fiber of a communication system.

By allowing gain medium 310 to have a wider cross-section than the typical single-fundamental-mode structure, gain medium 310 can produce higher output power than is the case with a gain medium that produces only a single transverse mode. Although gain medium 310 can produce light having multiple transverse modes, the light is coupled into single-mode fiber 330. Single-mode fiber 330 only couples light associated with the fundamental mode and thereby acts as a mode filter to exclude the higher order transverse modes. Because single-mode fiber 330 is disposed at least in part within the resonance cavity of laser 300, light associated with only the fundamental mode is allowed to travel within the entire resonance cavity. Therefore, only the light associated with the fundamental mode will be amplified and output by laser 300. Due to the high power design of the gain medium 310, this light associated with the fundamental mode will also have high power.

All transverse modes excluding the fundamental mode are filtered out by single-mode fiber 330 within the resonance cavity thereby preventing these modes from being amplified. Consequently, the output power of the light produced by the laser (i.e., at the fundamental mode) is higher than would be the case with a gain medium that produces only a single transverse mode.

Figure 7:
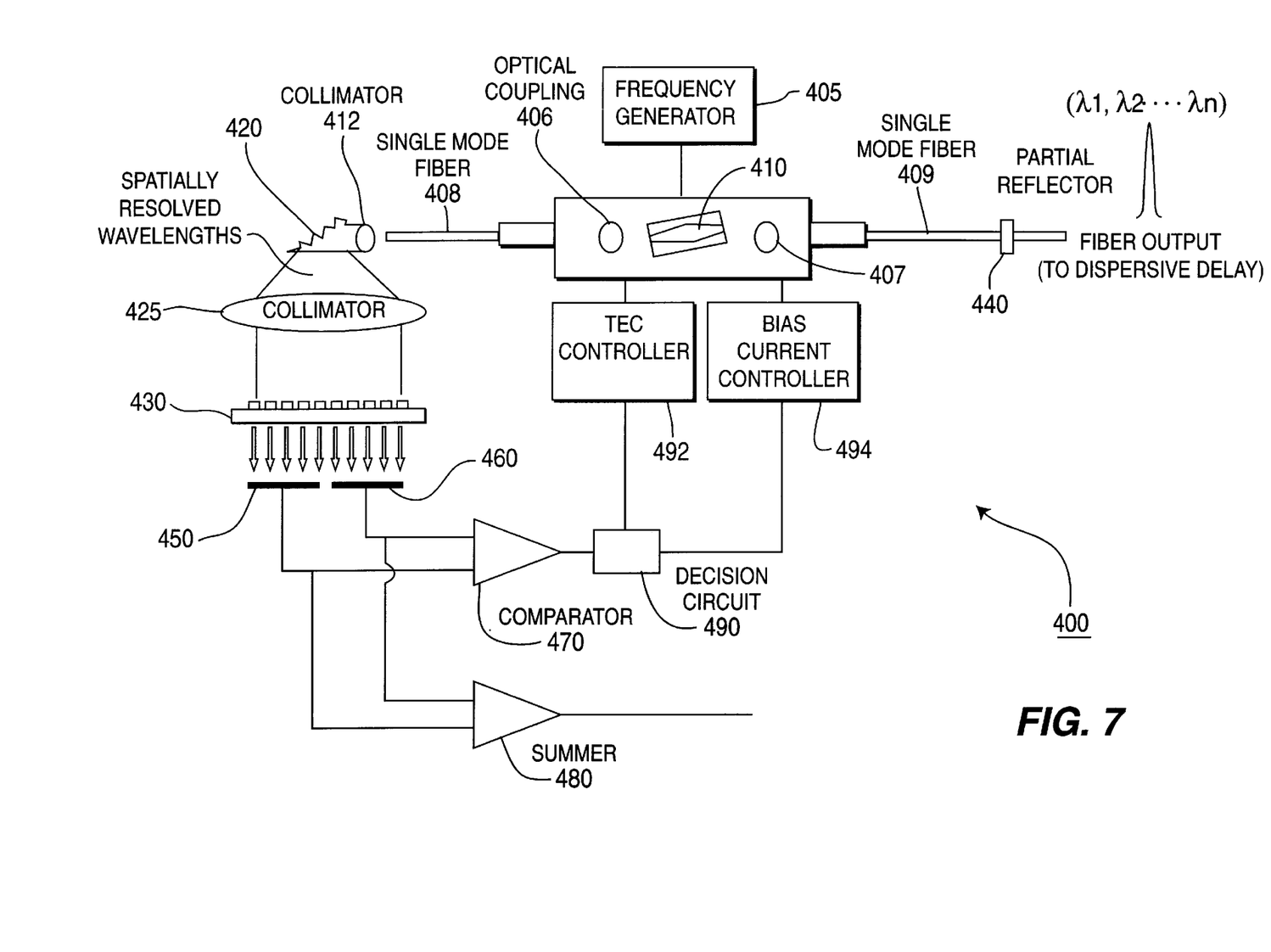
FIG. 7 illustrates a system block diagram of a multiple-wavelength laser system according to another embodiment of the present invention.

The features described above in reference to FIGS. 1–6 can be combined within a single system. FIG. 7 illustrates a system block diagram of such a multiple-wavelength laser system, according to an embodiment of the present invention.

The laser system 400 includes gain medium 410 that is coupled to frequency generator 405, optical couplers 406 and 407, and a TEC (not shown). Although gain medium 410 is shown in FIG. 7 as a diamond shaped SLD, other types of gain medium are possible. The diamond-shaped SLD is an example of a high power semiconductor optical amplifier. In general, any optical amplifier having a wide emitted beam cross-section produces high output power, but the diamond shape, or any shape having non-parallel guiding walls along the propagation path is one that minimizes the number of high order modes.

Optical couplers 406 and 407 couple the gain medium 410 to single-mode fibers 408 and 409. Single-mode fiber 408 is coupled to collimator 412 which is in turn coupled to dispersion element 420. Dispersion element 420 is coupled to collimator 425 which is in turn coupled to wavelength-selective element 430. Light transmitted by wavelength-selective element 430 is coupled to detectors 450 and 460. Detectors 450 and 460 are coupled to comparator 470 and summer 480. Comparator 470 is coupled to decision circuit 490 which is in turn coupled to TEC controller 492 and bias current controller 494. TEC controller 492 is coupled to gain medium 410. Bias current controller 494 is coupled to frequency generator 405. Decision circuit 490 is a circuit that determines whether fine adjustment or rough adjustment is desirable, and controls the bias current controller and TEC controller, respectively, based on the recommended adjustment.

Figure 8:
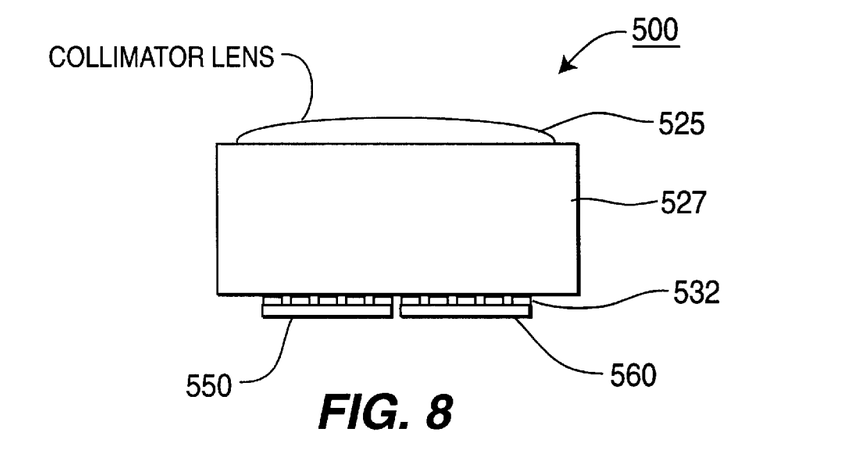
FIG. 8 shows a side view of a wavelength-selective element according to another embodiment the present invention.

Wavelength-selective element 430 can be combined with other components of laser system 400 and constructed as a monolithic component. FIG. 8 shows a side view of a wavelength-selective element according to another embodiment of the present invention.

Figure 9:
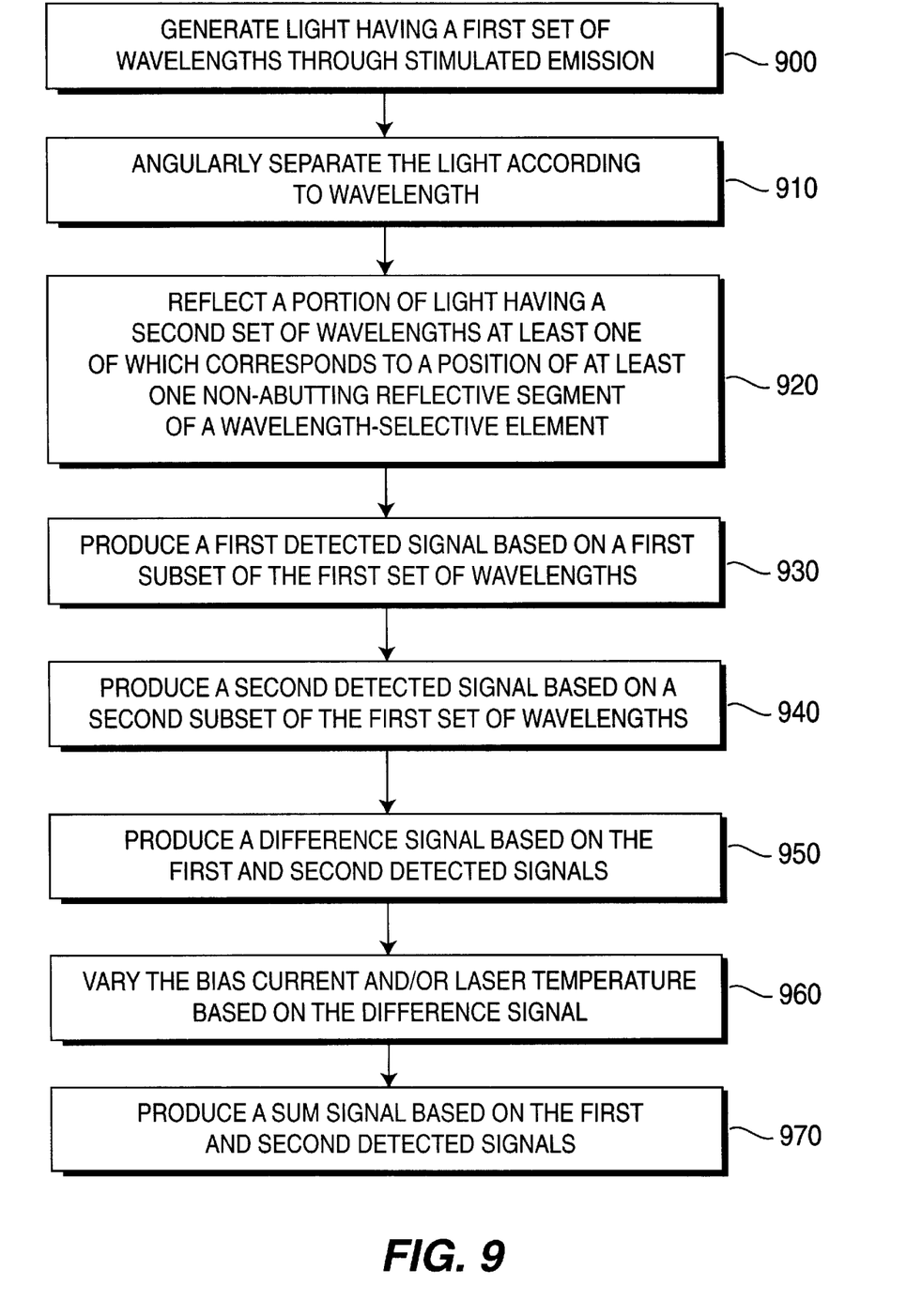
FIG. 9 shows a flowchart of a method for generating light having multiple wavelengths according to the present invention.

As shown in FIG. 8, a monolithic wavelength-selective element 500 includes non-abutting reflective elements 532, detectors 550 and 560, collimator lens 525 and transmission medium 527. Collimator lens 525 can be made of glass and uniformly formed with transmission medium 527, which also can be made of glass. Non-abutting reflective elements 532 can be formed directly on the end of transmission medium 527 opposite from collimator lens 525. Detectors 550 and 560 can be formed directly onto non-abutting reflective elements 532. Wavelength-selective element 500 is a rugged component due to its monolithic construction. FIG. 9 shows a flowchart of a method for generating light having multiple wavelengths according to the present invention. Although FIG. 9 is discussed below in reference to the embodiment of the multiple-wavelength laser system discussed above in reference to FIG. 7, the discussion is applicable to other embodiments of the present invention such as, for example, those described in reference to FIG. 1.

At step 900, light having a first set of wavelengths is generated through stimulated emission at the gain medium. For example, multiple-wavelength light can be generated at gain medium 410 through stimulated emission and directed over fibers 407 and 408. At step 910, the light generated in step 900 is angularly separated according to wavelength. For example, the light propagating over fiber 408 can be angularly (or spatially) separated by dispersion element 420 and directed to wavelength-selective element 430 through collimator 425.

At step 920, a portion of the light angularly separated in step 910 is reflected so that the reflected light has a second set of wavelengths. At least one wavelength of the second set of wavelengths corresponds to a position of at least one non-abutting segment of a wavelength-selective element. For example, wavelength-selective element 430 can have non-abutting reflective segments that reflect a portion of the received light. The portion of reflected light has a set of wavelengths that includes a portion of the wavelengths received. The position of the non-abutting reflective segments corresponds to the angular position of the wavelength components of the light directed to the wavelength-selective element.

At step 930, a first detected signal is produced based on a first subset of the wavelengths generated in step 900. For example, the first detected signal can be produced by detector 450 which detects an optical signal corresponding to a portion light transmitted by wavelength-selective element 430 and having the first subset of wavelengths. At 940, a second detected signal is produced based on a second subset of the wavelengths generated in step 900. For example, the second detected signal can be produced by detector 460 which detects an optical signal corresponding to another portion light transmitted by wavelength-selective element 430 and having the second subset of wavelengths.

At step 950, a difference signal is produced based on the first detected signal produced in step 930 and on the second detected signal produced in step 940. For example, the difference signal can be produced by comparator 470 based on the first and second detected signals received from detectors 450 and 460. At step 960, the bias current and/or gain medium temperature is varied based on the difference signal produced in step 950. For example, the bias current can be varied by bias current controller 494; the gain medium temperature can be varied by TEC controller 492.

At step 970, a sum signal is produced based on the first detected signal produced in step 930 and on the second detected signal produced in step 940. For example, a summer 480 can produce a sum signal which relates to the output power of the laser.

Figure 10:
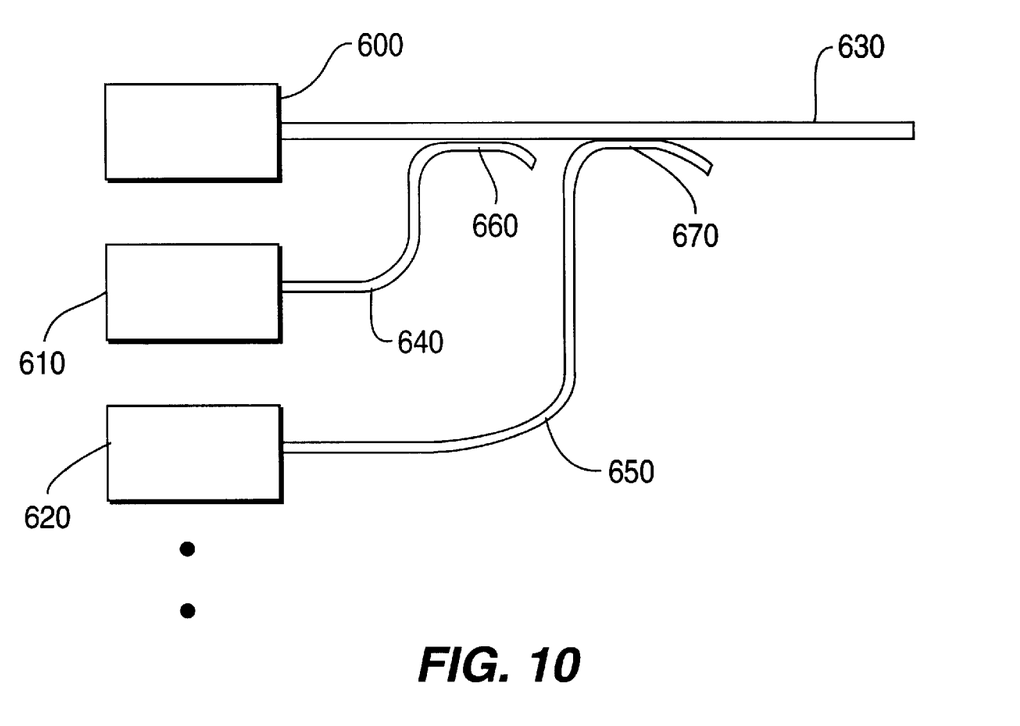
FIG. 10 shows an arrangement for multiplexing several multiple-wavelength lasers according to another embodiment of the present invention.

FIG. 10 shows an arrangement for multiplexing several multiple-wavelength lasers according to another embodiment of the present invention. Multiple 10 wavelength lasers 600, 610 and 620 produce output along fibers 630, 640 and 650, respectively. Multiple-wavelength lasers 600, 610 and 620 can be, for example, the laser described above in reference to FIG. 7 or another known type of multiple-wavelength laser. The fibers 640 and 650 can be coupled to fiber 630 by separate fiber wavelength-division multiplexers 660 and 670. The fiber wavelength-division multiplexers 660 and 670 can be made by, for example, fusing together the respective two fibers such that their cores are close enough for evanescent coupling. The fiber wavelength-division multiplexers 660 and 670 can be designed such that 100% of light from one fiber can be coupled to the other fiber over a precise wavelength range.

Although FIG. 10 shows three cascaded multiple-wavelength lasers, any number of multiple-wavelength lasers can be cascaded together. By cascading in the output of several multiple-wavelength lasers, the number of WDM channels that can be produced increases by a factor equal to the number of cascaded multiple-wavelength lasers. The wavelength-stabilization circuit discussed above can be used to tune the individual lasers so that they are multiplexed with non-overlapping spectrum. This technique of cascading several multiple-wavelength lasers can be very useful in WDM optical communication, particularly because the output lasers are already in a fiber and can be easily multiplexed together.

It should, of course, be understood that while the present invention has been described in reference to particular configurations, other configurations should be apparent to those of ordinary skill in the art. For example, the wavelength-stabilization circuit can be constructed from analog components, a digital arrangement or a combination of both.

What is claimed is:

1. A laser for producing light having a plurality of wavelengths, comprising:
   a gain medium disposed within a resonance cavity;
   a dispersion element coupled to said gain medium and disposed within the resonance cavity; and
   a wavelength-selective element coupled to said dispersion element, said wavelength-selective element defining an end of the resonance cavity, said wavelength-selective element having a plurality of non-abutting reflective segments, a position of at least one segment from the plurality of non-abutting reflective segments corresponding to at least one wavelength from the plurality of wavelengths.

2. A laser of claim 1, further comprising:
   a frequency generator coupled to said gain medium, said frequency generator varying an injection current to said gain medium at a frequency corresponding to a length of a resonance cavity, the resonance cavity being partially defined by said reflective element.

3. The laser of claim 1, further comprising:
   a single-mode fiber coupled to said gain medium and being disposed within the resonance cavity.

4. The laser of claim 1, further comprising:
   a single-mode fiber coupled to said gain medium and having a partial reflection portion, said single-mode fiber being disposed within the resonance cavity, the partial reflection portion of said single-mode fiber defining one end of the resonance cavity.

5. The laser of claim 1, wherein:
   said wavelength-selective element includes a plurality of absorption portions each absorption portion being disposed adjacent to at least one segment from the plurality of non-abutting reflective segments.

6. The laser of claim 1, wherein:
   said wavelength-selective element includes a transmissive substrate having a first side and a second side opposite the first side of the substrate,
   the non-abutting reflective portions being disposed on the first side, and
   an anti-reflective (AR) coating being disposed on a second side of the substrate.

7. The laser of claim 1, further comprising:
   a first detector coupled to a first portion of said wavelength-selective element;
   a second detector coupled to a second portion of said wavelength-selective element different from the first portion;
   a comparator coupled to the laser, said first detector and said second detector, said comparator producing a difference signal based on a first detected signal and a second detected signal; and
   a controller coupled to said comparator and the laser, said controller varying at least one of an injection bias of the laser and a temperature of the laser based on the difference signal.

8. The laser of claim 7, wherein:
   the first portion of said wavelength-selective element corresponds to a first set of non-abutting reflective portions of said wavelength-selective element,
   the second portion of said wavelength-selective element corresponds to a second set of non-abutting reflective portions of said wavelength-selective element.

9. The laser of claim 1, further comprising:
   a decision circuit coupled to said comparator and said controller, said decision circuit sending to said comparator a control signal based on the difference signal,
   said comparator varying the temperature of the laser for rough wavelength adjustment and varying the injection bias for fine wavelength adjustment.

10. The laser of claim 1, further comprising:
    a summer coupled to the laser, said summer producing a sum signal based on the first detected signal and the second detected signal, said summer producing an output signal related to an output power of the laser.

11. A wavelength-stabilization circuit for use with a laser for producing a plurality of wavelengths, comprising:
    a comparator to be coupled to the laser, said comparator producing a difference signal based on a first detected signal and a second detected signal, the first detected signal being based on a first optical signal having a first wavelength set from the plurality of wavelengths, the second detected signal being based on a second optical signal having a second wavelength set from the plurality of wavelengths; and
    a controller coupled to said comparator, said controller to be coupled the laser, said controller varying at least one of an injection bias of the laser and a temperature of the laser based on the difference signal.

12. The wavelength-stabilization circuit of claim 11, further comprising:
    a decision circuit coupled to said comparator and said controller, said decision circuit sending to said comparator a control signal,
    said comparator varying the temperature of the laser for rough wavelength adjustment and varying the injection bias for the wavelength adjustment.

13. The wavelength-stabilization circuit of claim 11, further comprising:
a summer to be coupled to the laser, said summer producing a sum signal based on the first detected signal and the second detected signal, said summer producing an output signal related to an output power of the laser.

14. The wavelength-stabilization circuit of claim 11, further comprising:
a first detector coupled to said comparator and a first set of non-abutting reflective portions of a wavelength-selective element of the laser, said first detector receiving the first optical signal from the first set of non-abutting reflective portions; and
a second detector coupled to said comparator and a second set of non7 abutting reflective portions of the wavelength-selective element different from the first set of non-abutting reflective portions, said second detector receiving the second optical signal from the second set of non-abutting reflective portions.

15. A laser having a resonance cavity defining a first end and a second end, comprising:
a gain medium disposed within the resonance cavity;
a single-mode fiber coupled to said gain medium and including a partial reflection portion, the partial reflection portion being the first end of the resonance cavity;
a dispersion element coupled to said gain medium and disposed within the resonance cavity; and
a reflective element coupled to said dispersion element and being the second end of the resonance cavity, said reflective element having a plurality of reflective segments arranged among a plurality of non-reflective segments.

16. The laser of claim 15, further comprising:
a wavelength-division multiplexer coupled to the signal-mode fiber and coupled to a second laser producing light having a first set of wavelength components different than a second set of wavelength components of light produced by the laser.

17. A method for operating laser producing a first plurality of wavelengths, comprising:
generating light through stimulated emission, the light having a second plurality of wavelengths;
angularly separating the light according to each wavelength from the second plurality of wavelengths; and
reflecting a portion of the light, the portion of light having the first plurality of wavelengths, at least one wavelength from the first plurality of wavelengths corresponding to a position of at least one segment from a plurality of non-abutting reflective segments of a wavelength-selective element.

18. The method of claim 17, further comprising:
varying a bias current to a gain medium at a frequency corresponding to length of a resonance cavity,
the light generated through stimulated emission being generated in a pulsed manner corresponding to the frequency of the injection current.

19. The method of claim 17, further comprising:
producing a first detected signal based on a first optical signal having a first wavelength set from the first plurality of wavelengths;
producing a second detected signal based on a second optical signal having a second wavelength set from the first plurality of wavelengths;
producing a difference signal based on the first detected signal and the second detected signal; and
varying at least one of a bias current and a temperature of the laser based on the difference signal.

20. The method of claim 19, wherein:
the temperature of the laser is varied for rough wavelength adjustment,
the bias current is varied for fine wavelength adjustment.

21. The method of claim 17, further comprising:
producing a first detected signal based on a first optical signal having a first wavelength set from the first plurality of wavelengths;
producing a second detected signal based on a second optical signal having a second wavelength set from the first plurality of wavelengths; and
producing a sum signal based on the first detected signal and the second detected signal, the sum signal being related to an output power of the laser.

* * * * *